United States Patent [19]

Nakatsukasa et al.

[11] 4,379,743

[45] Apr. 12, 1983

[54] SPUTTERING APPARATUS COMPRISING CONTROL MEANS FOR PREVENTING IMPURITY GASES FROM ENTERING A SPUTTERING CHAMBER

[75] Inventors: Masashi Nakatsukasa; Nobuyuki Takahashi, both of Fuchu, Japan

[73] Assignee: Anelva Corporation, Tokyo, Japan

[21] Appl. No.: 287,925

[22] Filed: Jul. 29, 1981

[30] Foreign Application Priority Data

Jul. 30, 1980 [JP] Japan ................................. 55/104531

[51] Int. Cl.$^3$ ............................................. C23C 15/00
[52] U.S. Cl. .................................................. 204/298
[58] Field of Search ......................................... 204/298

[56] References Cited

U.S. PATENT DOCUMENTS 3,294,670 12/1966 Charschan ............................ 204/298
3,521,765 7/1970 Kauffman et al. .................... 204/298
4,331,526 5/1982 Kuehnle ............................... 204/298

*Primary Examiner*—Arthur P. Demers

*Attorney, Agent, or Firm*—Laff, Whitesel, Conte & Saret

[57] ABSTRACT

In a sputtering apparatus comprising a main chamber for carrying out sputtering and a preliminary chamber for preliminarily processing a substrate prior to sputtering, a gate valve interposed between the chambers is opened with the pressure in the preliminary chamber is reduced lower than that in the main chamber after completion of the preliminary processing. The pressure reduction is carried out by reducing supply of a gas into the preliminary chamber by the use of a pressure control system coupled to the preliminary chamber. Preferably, the supply of the gas is bypassed through a valve to an exhausting system for the preliminary chamber. Alternatively, the pressure in the main chamber is made higher than that in the preliminary chamber after completion of the preliminary processing by squeezing an evacuation system for the main chamber to reduce the rate of evacuation. Supply of the gas into the preliminary chamber and evacuation of the main chamber may be simultaneously reduced.

4 Claims, 3 Drawing Figures

SPUTTERING APPARATUS COMPRISING CONTROL MEANS FOR PREVENTING IMPURITY GASES FROM ENTERING A SPUTTERING CHAMBER

BACKGROUND OF THE INVENTION

This invention relates to an automatic sputtering apparatus for successively carrying out sputtering to form a layer on a substrate.

As will later be described with reference to one of a few figures of the accompanying drawing, a conventional automatic sputtering apparatus comprises a sputtering or main chamber for carrying out sputtering and a preliminary chamber for preliminarily processing a substrate prior to introducing the substrate into the sputtering chamber. The preliminary and the sputtering chambers are usually coupled to each other through a gate valve interposed therebetween and to inlet and outlet chambers coupled to the preliminary and the main chambers, respectively.

In the conventional sputtering apparatus, the preliminary chamber is kept at a higher pressure than the sputtering chamber during automatic operation of the apparatus. As a result, when the gate valve is opened after completion of preliminary processing, impurity gases, such as vapor, oxygen, and nitrogen, which are inevitably produced during the preliminary processing, flow into the sputtering chamber together with the substrate subjected to the preliminary processing. Such impurity gases contaminate a gas filled in the sputtering chamber and considerably deteriorate quality of a layer formed on each substrate.

It may be possible to avoid an adverse affect of the impurity gases if the gate valve is manually controlled. However, manual control of the gate valve is difficult to carry out and is not suitable for automatically and successively processing a great number of substrates at a high speed.

SUMMARY OF THE INVENTION

It is an object of this invention to provide a sputtering apparatus wherein a substrate is capable of being transferred from a preliminary chamber to a sputtering chamber without introduction of any impurity gases into the sputtering chamber.

It is another object of this invention to provide a sputtering apparatus of the type described, wherein a substrate is capable of being automatically and successively processed at a high speed.

A sputtering apparatus to which this invention is applicable comprises a main chamber defining a main hollow space, first means for holding a substrate in the main hollow space, second means for sputtering a predetermined material onto the substrate held by the first means to form a layer of the material, a preliminary chamber defining a preliminary hollow space, third means for carrying out preliminary processing of a substrate in said preliminary hollow space, valve means for selectively isolating the main and the preliminary hollow spaces from each other and making the main and the preliminary hollow spaces communicate with each other for transfer of the substrate from the third means to the first means, first pressure controlling means coupled to the main hollow space for controlling a first pressure in the main hollow space, second pressure controlling means coupled to the preliminary hollow space for controlling a second pressure in the preliminary hollow space. According to this invention, the sputtering device comprises control means coupled to the valve means and at least to a selected one of the first and the second pressure controlling means for controlling the selected pressure controlling means with reference to completion of the preliminary processing and for opening the valve means after the second pressure becomes less than the first pressure.

DESCRIPTION OF THE PREFERRED EMBODIMENTS

Figure 1:
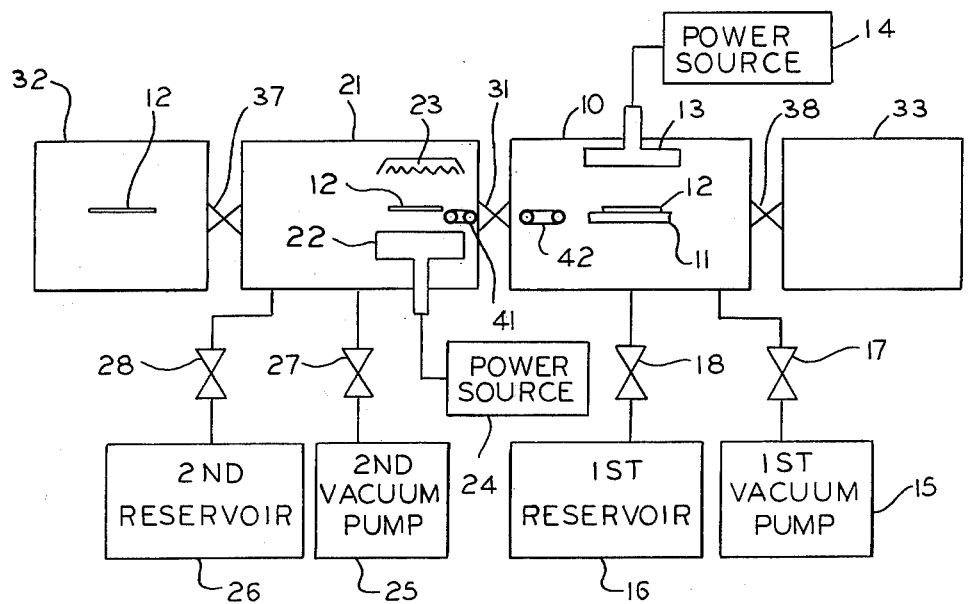
FIG. 1 shows a schematic block diagram of a conventional sputtering apparatus.

Referring to FIG. 1, a conventional sputtering apparatus comprises a main chamber 10 defining a main hollow space, a holder 11 for holding a substrate 12 in the main hollow space, and a sputtering electrode or target 13 for sputtering a predetermined material, such as aluminum or the like onto the substrate 12 held by the holder 12 to form a layer of the material. A power source 14 is coupled to the sputtering electrode 13 to provide an electrical voltage of a high frequency. A first vacuum pump 15 and a first reservoir 16 are coupled to the main chamber 10 through a first throttle valve 17 and a first inlet valve 18, respectively. The first gas reservoir 16 keeps an inert gas, such as argon. A combination of the first vacuum pump 15, the first reservoir 16, and the valves 17 and 18 serves as a first pressure controlling system for controlling a first pressure in the main hollow space. The main hollow space is usually kept at a pressure between $1 \times 10^{-3}$ and $5 \times 10^{-2}$ Torr by the use of the first pressure controlling system while the substrate 12 is processed in the main hollow space.

In FIG. 1, the sputtering apparatus comprises a preliminary chamber 21 defining a preliminary hollow space. In the preliminary hollow space, a substrate 12 is preliminarily processed before introduced into the main hollow space. In the illustrated preliminary chamber 21, the substrate 12 is subjected to etching on a support member 22 and/or to heat treatment by a heater 23. At any rate, the substrate 12 is kept on the support member 22 during the preliminary processing procedure. The support member 22 is coupled to a power source 24 to provide an electrical voltage of a high frequency. The heater 23 is also connected to an electric power source (not shown).

A second vacuum pump 25 and a second reservoir 26 are coupled to the preliminary chamber 21 through a second throttle valve 27 and a second inlet valve 28, respectively. An inert gas, such as argon, is kept in the second reservoir 26. A combination of the second vacuum pump 25, the second reservoir 26, the second throttle valve 27, and the second inlet valve 28 serves as a second pressure controlling system for controlling a second pressure in the preliminary hollow space. The second pressure is controlled by the second pressure controlling system during the preliminary processing, with each of the valves 27 and 28 opened and with the second vacuum pump 25 put into operation, and is kept at a pressure between $5\times 10^{-3}$ Torr and $10^{-2}$ Torr. It should be noted here that the second pressure is not lower than the first pressure in the main hollow space when the substrate 12 is preliminarily processed.

Further referring to FIG. 1, a first gate valve 31 is interposed between the main and the preliminary chambers 10 and 21 to isolate the main and the preliminary hollow spaces from each other or to make the main and the preliminary hollow spaces communicate with each other. As the gate valve 31, use is possible of various types of conventional gate valves each of which comprises a cylinder bar vertically and reciprocally moved in accordance with an electric signal and a seal member attached to an end of the cylinder bar for sealing windows opened on both of walls of the first and the second chambers 10 and 21 when the cylinder bar is moved upwards.

The sputtering apparatus further comprises inlet and outlet chambers 32 and 33 which define inlet and outlet hollow spaces, respectively, and which are coupled to the preliminary and the main chambers 21 and 10 through second and third gate valves 37 and 38, respectively. Each of the second and the third gate valves 37 and 38 is similar in structure to the first gate valve 31.

In FIG. 1, a substrate 12 to be processed is first introduced into the inlet chamber 32 with the second gate valve 37 closed. After introduction of the substrate 12, the inlet hollow space is exhausted by the use of an exhausting system (not shown) to a reduced pressure of, for example, $10^{-6}$ Torr. Next, the substrate 12 in the inlet chamber 32 is fed by the use of a conveyor or the like (not shown) out of the inlet hollow space into the preliminary chamber 21 through the second gate valve 37 which is now opened. After the substrate 12 is led into the preliminary hollow space, the second gate valve 37 is closed in a usual manner.

The substrate 12 in the preliminary hollow space is placed onto the support member 22 through a conveyor (not shown). In this state, the first and the second gate valves 31 and 37 are closed. The power source 24 is energized during a preselected interval of time to etch the substrate 12 placed on the supporting member 22. If necessary, heat treatment is carried out by the use of the heater 22. Thus, the substrate 12 is preliminarily processed in the preliminary hollow space.

After completion of the preliminary processing, the preliminarily processed substrate 12 is sent onto a first conveyor, namely, transferring member 41 and conveyed towards the first gate valve 31 which is previously opened before the substrate 12 reaches the first gate valve 31. Therefore, the preliminarily processed substrate 12 is fed through the first gate valve 31 into the main hollow space.

In the main hollow space, the substrate 12 is conveyed onto the holder 11 by an additional conveyor 42. Sputtering is, thereafter, carried out during a predetermined time interval of, for example, a few minutes in a usual manner to form a layer on the substrate 12. The layer formed substrate is transferred from the main hollow space to the outlet hollow space through the third gate valve 38. After transfer of the layer formed substrate, the pressure of the outlet hollow space is changed from a reduced pressure of, for example, $10^{-6}$ Torr to the atmospheric pressure by a gas inlet system (not shown), with the third gate valve 38 closed. Thus, the layer formed substrate is taken out from the outlet chamber 33.

The layer formed substrate may be returned back to the inlet chamber 32 from the main chamber 10 through the preliminary chamber 21.

With the above-mentioned sputtering apparatus, impurity gases, such as vapor, oxygen, nitrogen, and the like are coexistent in the preliminary hollow space with the inert gas introduced from the second gas reservoir 26 when the preliminary processing is completed. In addition, the second pressure in the preliminary hollow space is higher than the first pressure in the main hollow space.

Under the circumstances, when the first gate valve 31 is opened after the substrate 12 is put onto the conveyor 41, the impurity gases objectionably flow into the main hollow space through the first gate valve 31.

Such impurity gases adversely affect the layer formed on the substrate 12 in the main hollow space, as pointed out in the preamble of the instant specification.

Figure 2:
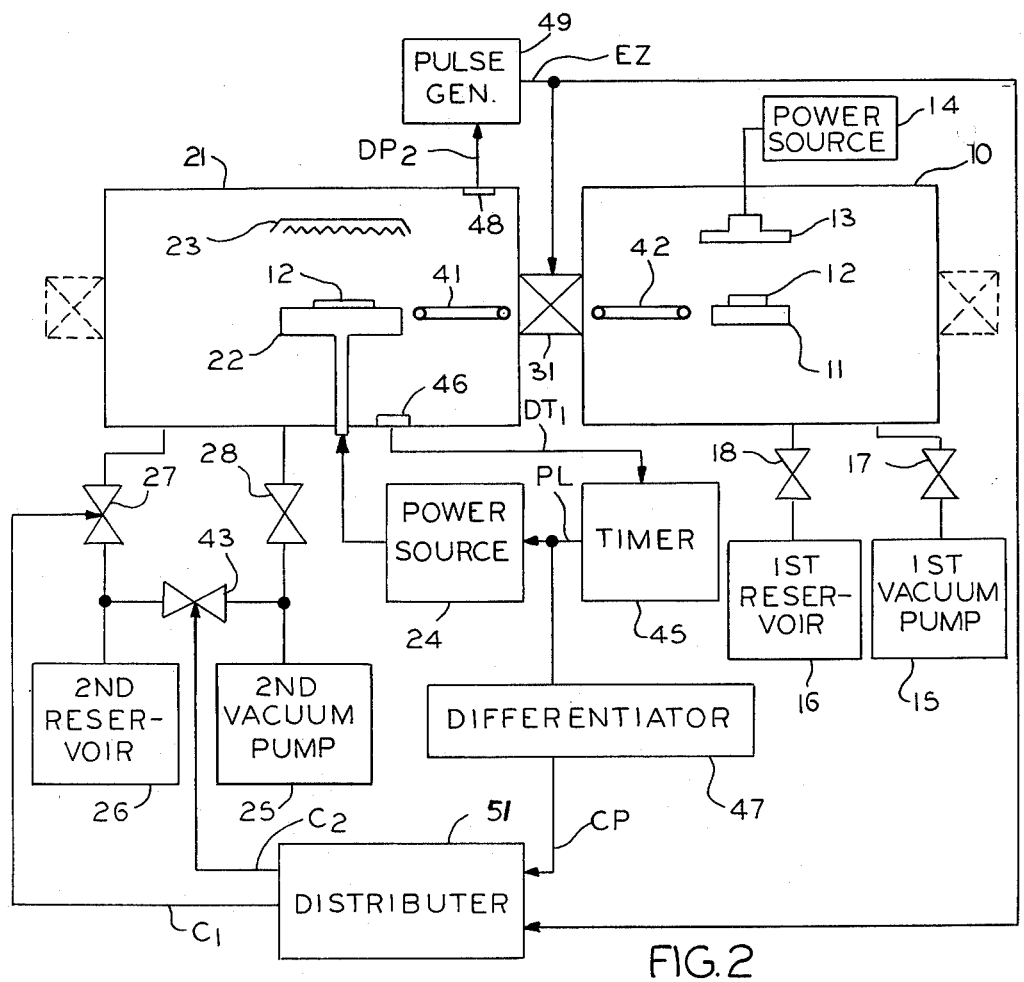
FIG. 2 shows a schematic block diagram of a sputtering apparatus according to a preferred embodiment of this invention.

Referring to FIG. 2, a sputtering apparatus according to a preferred embodiment of this invention comprises similar parts designated by like reference numerals. The sputtering apparatus further comprises a bypassing valve 43 between the second reservoir 26 and the second vacuum pump 25, as will later be described, and a timer 45 coupled to the electric power source 24 for producing a timer pulse PL. The timer pulse PL defines a processing period lasting, for example, a few minutes. The timer 45 is energized by a first detection signal $DT_1$ supplied from a detector symbolized by 46. The first detection signal $DT_1$ is produced by the detector 46 when the substrate 12 to be preliminarily processed is held on the support member 22. As the detector 46, use is possible of a conventional optical, electrical, or mechanical element.

During presence of the timer pulse PL, the substrate 12 is preliminarily processed by the use of the support member 22 and/or the heater 23. The preliminary processing is completed by disappearance of the timer pulse PL. A trailing edge detector or differentiator 47 produces a completion pulse CP indicative of the completion of the preliminary processing on detecting the trailing edge of the timer pulse PL. Thus, a combination of the timer 45, the detector 46, and the differentiator 47 serves to detect the completion of the preliminary processing.

When the preliminary processing is completed, the substrate 12 is transferred from the support member 22 onto the conveyor 42 in a usual manner and conveyed towards the first gate valve 31.

In FIG. 2, an optical sensor 48 is attached to the preliminary chamber 21 at a preselected position over the conveyor 41. The preselected position is adjacent to the first gate valve 31. When the substrate 12 on the conveyor 41 traverses the preselected position, the optical sensor 48 produces a second detection pulse $DP_2$. It is mentioned here that the second detection pulse $DP_2$ appears when a predetermined period of, for example, several seconds lapses after the completion of the preliminary processing. Responsive to the second detection pulse $DP_2$, a pulse generator 49 produces a driving pulse EZ lasting a prescribed period of, for example, one or two seconds following the predetermined period. The driving pulse EZ is delivered to the first gate valve 31 to open the first gate valve 31 during presence thereof. Thus, the optical sensor 48 and the pulse generator 49 are operable as a driving pulse generating circuit for generating the driving pulse EZ.

Further referring to FIG. 2, the completion pulse CP and the driving pulse EZ are supplied to a distributor 51 coupled to the second inlet and the bypassing valves 27 and 43. The distributor 51 produces first and second valve control pulses $C_1$ and $C_2$ both of which have polarities different from each other and last the predetermined period defined between the completion and the driving pulses CP and EZ. The first valve control pulse $C_1$ is delivered from the distributor 51 to the second inlet valve 27. As a result, the second inlet valve 27 is closed during presence of the first valve control pulse $C_1$. Therefore, supply of the gas from the second reservoir 26 into the preliminary hollow space is interrupted or considerably reduced.

On the other hand, the bypassing valve 43 is opened by the second valve control pulse $C_2$ during the predetermined period.

It should be noted here that the second vacuum pump 25 is put into operation even during the predetermined period. Therefore, the gas flows from the second reservoir 26 to the second vacuum pump 25 through the third inlet valve 43. Thus, the third inlet valve 43 serves to bypass the gas to the second vacuum pump 25 during the predetermined period.

From the above, it is readily understood that the preliminary chamber 21 is exhausted, with the second inlet valve 27 closed, during presence of the first and the second valve control pulses $C_1$ and $C_2$. The second pressure of the preliminary hollow space is, therefore, reduced after production of the completion pulse CP until generation of the driving pulse EZ. This means that the distributor 51 is operable to reduce supply of the gas by producing the first and the second valve control pulses $C_1$ and $C_2$ after reception of the completion pulse CP.

In fact, it was confirmed with the preferred embodiment that the second pressure was reduced from a high pressure, such as $10^{-2}$ Torr, to a low pressure, such as $10^{-4}$ Torr, in a few seconds and securely restored from $10^{-4}$ Torr to $10^{-2}$ Torr in a few seconds. Inasmuch as the first pressure in the main hollow space is kept at about $10^{-3}$ Torr, the second pressure becomes less than the first pressure before the preliminarily processed substrate 12 is conveyed to the preselected position and, as a result, the first gate valve 31 is opened by the driving pulse EZ. The preliminarily processed substrate 12 is therefore transferred from the preliminary hollow space to the main hollow space through the first gate valve 31 without any interruption.

In the main hollow space, the substrate 12 is processed in a similar manner illustrated with reference to FIG. 1.

Simultaneously with the transfer of the preliminarily processed substrate 12, a next following unprocessed substrate is introduced from the inlet hollow space into the preliminary hollow space.

Thus, the second pressure controlling system comprising the elements 25 through 28 is controlled by a combination of the driving circuit (48 and 49), the detection circuit (45, 46 and 47), and the distributor 51. In other words, the combination is for controlling the second pressure controlling circuit with reference to the completion of the preliminary processing to open the first gate valve 31 after the second pressure becomes less than the first pressure.

With the preferred embodiment, use is made of the bypassing valve 43 in bypassing the gas to the second vacuum pump 25 during closure of the second inlet valve 27. Therefore, a flow rate of the gas is substantially constant even during closure of the second inlet valve 27. This means that it is possible to rapidly restore the second pressure to a high pressure, such as $10^{-2}$ Torr, after the second pressure is reduced to a low pressure, such as $10^{-4}$ Torr. In other words, the restoration is delayed when the second inlet valve 27 alone is used without the bypassing valve 43. This is because the flow rate of the gas is slow to be restored to a constant flow rate once the gas flow is interrupted by the second inlet valve 27.

However, the bypassing valve 43 may be omitted if it takes a long time to convey the preliminarily processed substrate 12 from the electrode member 22 to the first gate valve 31 or if the preliminarily processed substrate 12 may be placed in the preliminary hollow space for a long time until the second pressure is restored to a predetermined pressure.

Figure 3:
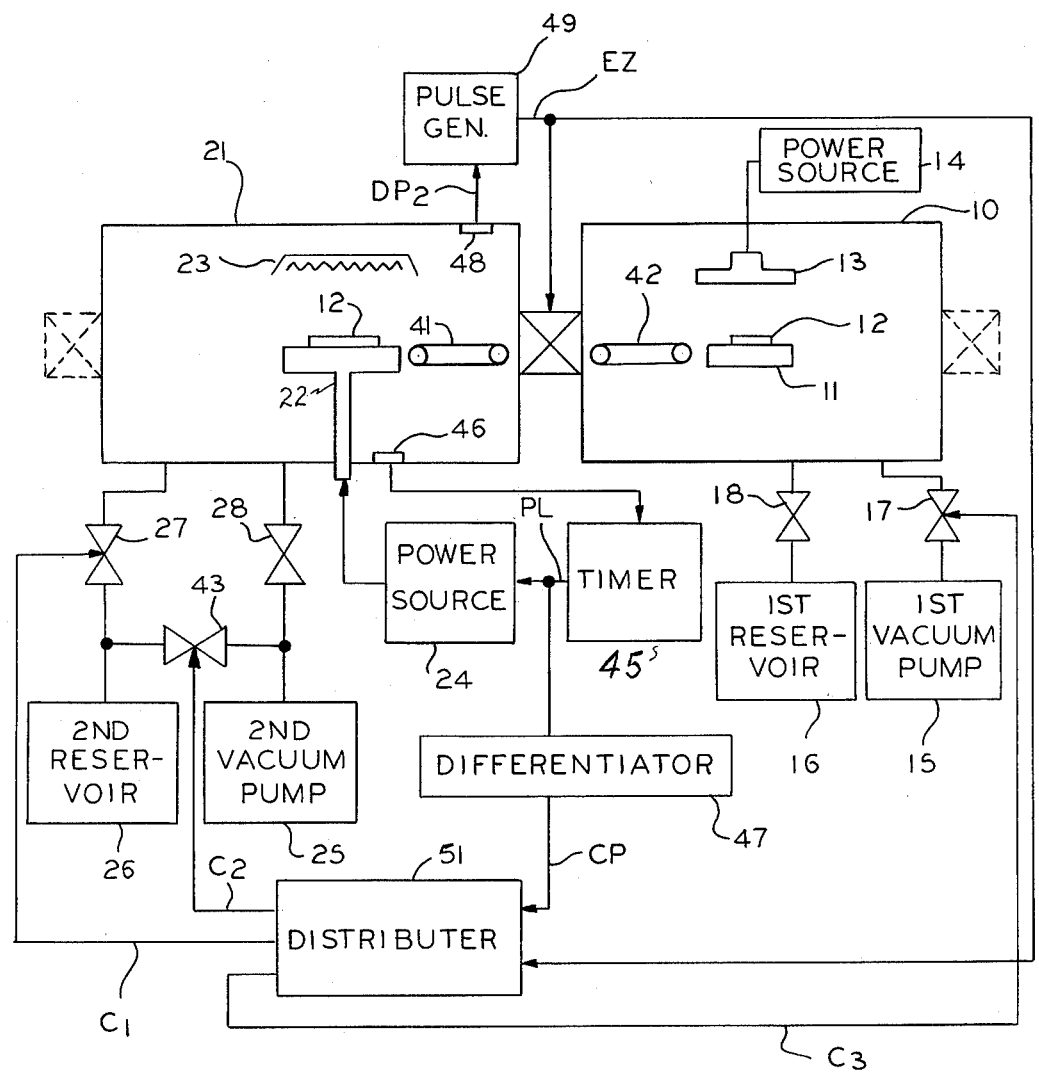
FIG. 3 shows a schematic block diagram of a sputtering apparatus according to a modification of the preferred embodiment illustrated in FIG. 2.

Turning to FIG. 3, a sputtering apparatus according to a modification of the preferred embodiment of this invention comprises, as a first pressure control system, a first vacuum pump 15, a first reservoir 16, a first throttle valve 17, and a first inlet valve 18, as is the case with that of FIG. 1. The first vacuum pump 15 and the first throttle valve 17 are operable as an exhausting system for exhausting the main chamber 10 while the first reservoir 16 and the first inlet valve 18, as a gas inlet system for introducing a preselected gas into the main hollow space.

In addition to controlling the second and the third inlet valves 27 and 43, the exhausting system is squeezed to reduce or interrupt evacuation of the main hollow space before the first gate valve 31 is opened. More particularly, the first throttle valve 17 is squeezed by a third valve control signal $C_3$ supplied from the distributor 51 during the predetermined period described in conjunction with the preferred embodiment, with the gas inlet system put into operation. As a result, the first pressure becomes temporarily higher than the second pressure before introduction of the substrate into the main hollow space.

While this invention has thus far been described in conjunction with a preferred embodiment thereof, it will be readily possible for those skilled in the art to put this invention into practice in various manners. For example, the first throttle valve 17 alone may be controlled prior to opening the first gate valve 31, instead of control of the second and the third inlet valves 27 and 43. In this case, a detection circuit may be optically coupled to the additional conveyor 42, instead of the detection circuit (48 and 49) coupled to the conveyor 41.

What is claimed is:

1. A sputtering apparatus comprising a main chamber defining a main hollow space, first means for holding a substrate in said main hollow space, second means for sputtering a predetermined material onto the substrate held by said first means to form a layer of said material, a preliminary chamber defining a preliminary hollow space, third means for carrying out preliminary processing of a substrate in said preliminary hollow space, valve means for selectively isolating said main and said preliminary hollow spaces from each other and making said main and said preliminary hollow spaces communicate with each other for transfer of the substrate from said third means to said first means, first pressure controlling means coupled to said main hollow space for controlling a first pressure in said main hollow space, second pressure controlling means coupled to said preliminary hollow space for controlling a second pressure in said preliminary hollow space, wherein the improvement comprises:

control means coupled to said valve means and at least to a selected one of said first and said second pressure controlling means for controlling said selected pressure controlling means with reference to completion of said preliminary processing and for opening said valve means after said second pressure becomes less than said first pressure.

2. A sputtering apparatus as claimed in claim 1, said second pressure controlling means being coupled as said selected pressure controlling means to said control means and comprising gas supplying means coupled to said preliminary chamber for supplying said preliminary hollow space with a predetermined gas and evacuating means coupled to said preliminary chamber for evacuating said preliminary hollow space, wherein said control means comprises:

detecting means coupled to said third means for detecting said completion of said preliminary processing to produce a completion pulse indicative of said completion;

driving pulse generating means operatively coupled to said third means and said valve means for generating a driving pulse when a predetermined period lapses after said completion of said preliminary processing;

means for delivering said driving pulse to said valve means thereby to open said valve means; and reducing means responsive to said completion pulse and said driving pulse and coupled to said gas supplying means for reducing supply of said gas after production of said completion pulse until generation of said driving pulse, with said evacuating means put into operation, so that said second pressure becomes less than said first pressure during said predetermined period.

3. A sputtering apparatus as claimed in claim 2, said gas supplying means comprising a reservoir for said predetermined gas and an inlet valve between said reservoir and said preliminary chamber for introducing said gas into said preliminary chamber, wherein said reducing means comprises:

signal producing means responsive to said completion pulse and said driving pulse for producing first and second valve control pulses both of which have polarities different from each other and last said predetermined period; and means for delivering said first valve control pulse to said inlet valve to close said inlet valve during said predetermined period;

said apparatus further comprising a bypassing valve responsive to said second valve control pulse and interposed between said reservoir and said exhausting means for bypassing said gas to said exhausting means during said predetermined period.

4. A sputtering apparatus as claimed in claim 1, said first pressure controlling means being coupled as said selected pressure controlling means to said control means and comprising exhausting means for exhausting said main chamber and gas inlet means for supplying a preselected gas into said main hollow space, wherein said control means comprises:

detecting means coupled to said third means for detecting said completion of said preliminary processing to produce a completion pulse indicative of said completion;

means responsive to said completion pulse and coupled to said valve means for opening said valve means after said completion of said preliminary processing; and means for squeezing said exhausting means prior to opening of said valve means, with said inlet means put into operation, so that said first pressure becomes higher than said second pressure before said valve means is opened.

\* \* \* \* \*